US006567314B1

(12) United States Patent
Ogura et al.

(10) Patent No.: US 6,567,314 B1
(45) Date of Patent: May 20, 2003

(54) DATA PROGRAMMING IMPLEMENTATION FOR HIGH EFFICIENCY CHE INJECTION

(75) Inventors: Tomoko Ogura, Wappingers Falls, NY (US); Seiki Ogura, Wappingers Falls, NY (US)

(73) Assignee: Halo Lsi, Inc., Wappingers Falls, NY (US)

( * ) Notice: Subject to any disclaimer, the term of this patent is extended or adjusted under 35 U.S.C. 154(b) by 0 days.

(21) Appl. No.: 10/003,842

(22) Filed: Dec. 4, 2001

Related U.S. Application Data
(60) Provisional application No. 60/250,858, filed on Dec. 4, 2000.

(51) Int. Cl.⁷ .............................. G11C 16/04; G11C 7/00; G11C 8/00
(52) U.S. Cl. ............... 365/185.28; 365/203; 365/230.06
(58) Field of Search ......................... 365/185.28, 185.26, 365/185.21, 185.14, 185.01, 203, 230.06, 226

(56) References Cited

U.S. PATENT DOCUMENTS

| | | | |
|---|---|---|---|
| 5,753,951 A | 5/1998 | Geissler ..................... 257/316 |
| 5,874,337 A | 2/1999 | Geissler ..................... 438/259 |
| 5,886,927 A * | 3/1999 | Takeuchi ................. 365/185.2 |
| 6,049,899 A * | 4/2000 | Auclair et al. ............... 365/184 |
| 6,166,410 A | 12/2000 | Lin et al. ..................... 257/324 |
| 6,243,297 B1 * | 6/2001 | Nagatomo ............. 365/185.23 |
| 6,275,415 B1 | 8/2001 | Haddad et al. ........ 365/185.11 |
| 6,288,941 B1 * | 9/2001 | Seki et al. ............. 365/185.11 |
| 6,345,000 B1 * | 2/2002 | Wong et al. ........... 365/185.05 |
| 6,426,894 B1 * | 7/2002 | Hirano ................... 365/185.18 |

OTHER PUBLICATIONS

"A Dual Page Programming Scheme for High Speed Multi-Gb-Scale NAND Flash Memories," by Ken Takeuchi et al., IEEE 2000 Symposium on VLSI Circuits Digest of Technical Papers, Jun. 2000, pp. 156–157.

* cited by examiner

Primary Examiner—Thong Le
(74) Attorney, Agent, or Firm—George O. Saile; Stephen B. Ackerman

(57) ABSTRACT

In the present invention a new method and circuit is disclosed to handle write data during CHE programming for a nonvolatile memory cell including cells created with MONOS technology. A plurality of bit lines are precharged to program inhibit all memory cells coupled to the bit lines. Then a selective bit line is discharged to program the selected memory cell. The number of bit lines selected to be precharged can be reduced to the bit line to be programmed to save power, and precharging a bit line can be done simultaneously with applying program data to a bit line to reduce the number of times a bit line is charged. The number of data latches may be reduced to the actual program data width, resulting in significant area savings and circuit simplification.

27 Claims, 4 Drawing Sheets

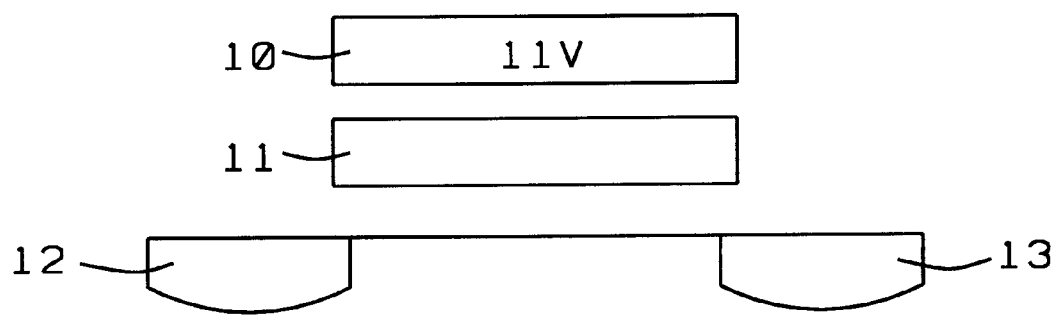
FIG. 1 - Prior Art
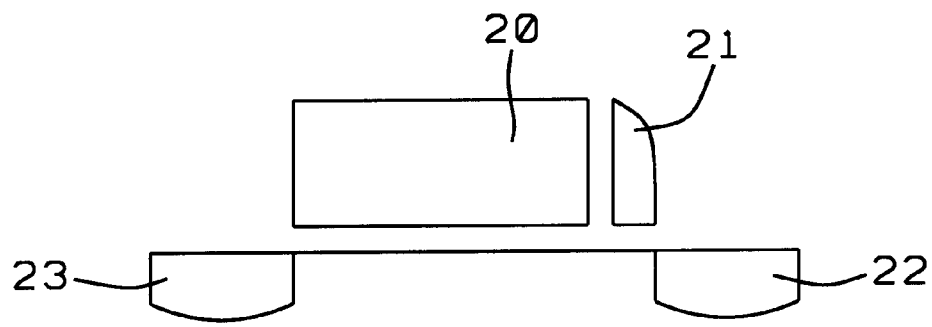
FIG. 2A
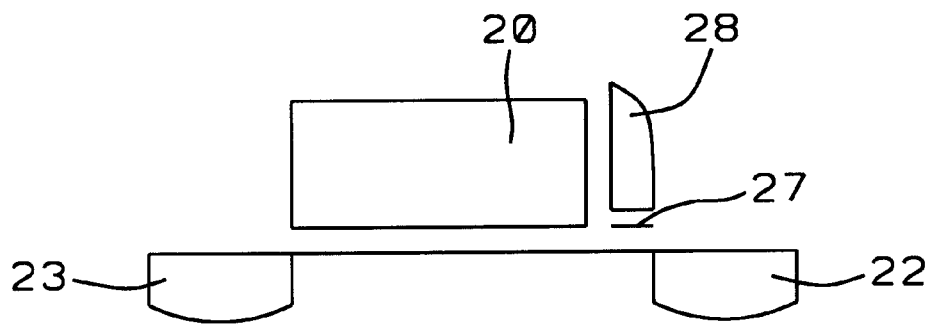
FIG. 2B

DATA PROGRAMMING IMPLEMENTATION FOR HIGH EFFICIENCY CHE INJECTION

The instant application claims priority to U.S. Provisional Application Ser. No. 60/250,858 filed Dec. 4, 2000, which is herein incorporated by reference.

BACKGROUND OF THE INVENTION

1. Field of the Invention

The present invention relates to semiconductor memories and in particular to non-volatile floating gate and MONOS memories.

2. Description of the Related Art

A conventional two poly planar floating gate device structure is shown in FIG. 1. The word select gate 10 is a polysilicon gate stacked above a floating gate 11, which is also polysilicon. Two diffusions form the source 13 and drain 12. In order to program the memory cell, electrons must cross the oxide barrier into the floating gate 11. There are two main mechanisms for program, Channel Hot Electron injection (CHE) and Fowler-Nordheim tunneling (FN). Typical CHE voltages are as follows: The word gate 10 is biased to 11 V, and the program drain 12 is biased to 8V. The voltage of source diffusion 13 is grounded. In this device structure, CHE requires a high drain to source voltage and is characterized by program currents of greater than 100 uA per cell. Program data widths are usually limited to 8, 16 or 32 bits because of high voltage charge pump constraints.

In Fowler-Nordheim tunneling program, the word gate 10 is usually biased to a high voltage of 20V, and both the source 13 and drain 12 are grounded. Program currents are on the order of 10 nA/cell, so all cells sharing a single word line and can be selected and programmed together without needing a high current charge pump. For a conventional NAND array device that utilizes FN program, a page buffer is usually implemented in which there exists one program data latch for each bit diffusion line. The cells on a word line which are not to be programmed to a high threshold "0" state need to be program inhibited. Implementation of the page buffer presents a layout challenge and significant area penalty.

An implementation of program data latches in a page buffer is described in "A Dual Page Programming Scheme for High Speed Multi-Gb-Scale NAND Flash Memories", by Ken Takeuchi and TomoharuTanaka, IEEE 2000 Symposium on VLSI Circuits Digest of Technical Papers, June 2000, pp 156–157. In this paper, two memory blocks share one page buffer, by taking advantage of the zero drain to source current during FN program. Bit line leakage was shown to be less than 0.1 mV. The values of the data latches could be coupled to the bit lines of one block and then safely floated, during program. The same data latches could then be used to program a second block, at the same time, reducing the number of data latches needed by half. However, this particular configuration could only be used by FN program, because the non-zero drainsource current in CHE program will not allow for floating bit lines.

In U.S. Pat. No. 6,275,415 B1 (Haddad et al) a memory device is directed to having multiple memory cells with a method of programming multiple memory cells wherein a bias voltage is applied to a common source terminal and a time varying voltage is applied to gates of cells to be programmed and using channel hot electrons (CHE). U.S. Pat. No. 5,753,951 (Geissler) is directed to CHE injection techniques where the memory cell has a floating gate structure that extends over a sharp edge of a memory cell trench and then into the trench. U.S. Pat. No. 5,874,337 (Geissler) is directed toward the method of creating a memory cell with a floating gate structure that extends over and into a memory cell ctiewzw trench. U.S. Pat. No. 6,166,410 (Lin et al.) is directed to a structure and method of manufacture of a split gate MONOS memory device having a MONOS transistor in series with a stacked polysilicon gate flash transistor.

SUMMARY OF THE INVENTION

An objective of the present invention is to provide a new method for writing data using CHE programming for non-volatile floating gate and MONOS memories.

Another objective of the present invention is to provide a new circuit to handle write data during CHE programming.

Yet another objective of the present invention is to provide a bit line precharge to inhibit all memory cells before a selective bit line discharge is done to program selected memory cells.

A further objective of the present invention is to reduce the number of sense amplifiers and write data circuits to be equal to the program data width.

Again a further objective of the present invention is to produce a write data circuit that is constructed with logic transistors.

Again a further objective of the present invention is to simplify circuitry required to write data for non-volatile floating gate and MONOS memories.

Still a further objective is to selectively precharge bit lines for low power and low current operations.

Yet a further objective of the present invention is produce circuit area savings through reduction in the complexity of circuitry associated with writing data to nonvolatile floating gate and MONOS memories.

Still yet a further objective of the present invention is to reduce the oxide thickness of decode transistors and reduce high voltage transistors.

A new method and circuit to handle write data during CHE program is described in the present invention. A sequence of first precharging memory bit lines and then discharging the bit lines is used to program selected memory cells. A bit line precharge is first implemented to program inhibit all memory cells, and then a selective bit line discharge is done to program selected memory cells. The number of data latches needed is reduced to the actual program data width resulting in significant area savings and circuit simplification.

BRIEF DESCRIPTION OF THE FIGURES

This invention will be described with reference to the accompanying drawings, wherein:

FIG. 1 shows a two poly planar floating gate device structure of prior art,

FIGS. 2A and 2B show split gate flash memory devices of the present invention,

DETAILED DESCRIPTION OF THE PREFERRED EMBODIMENT

Figure 3:
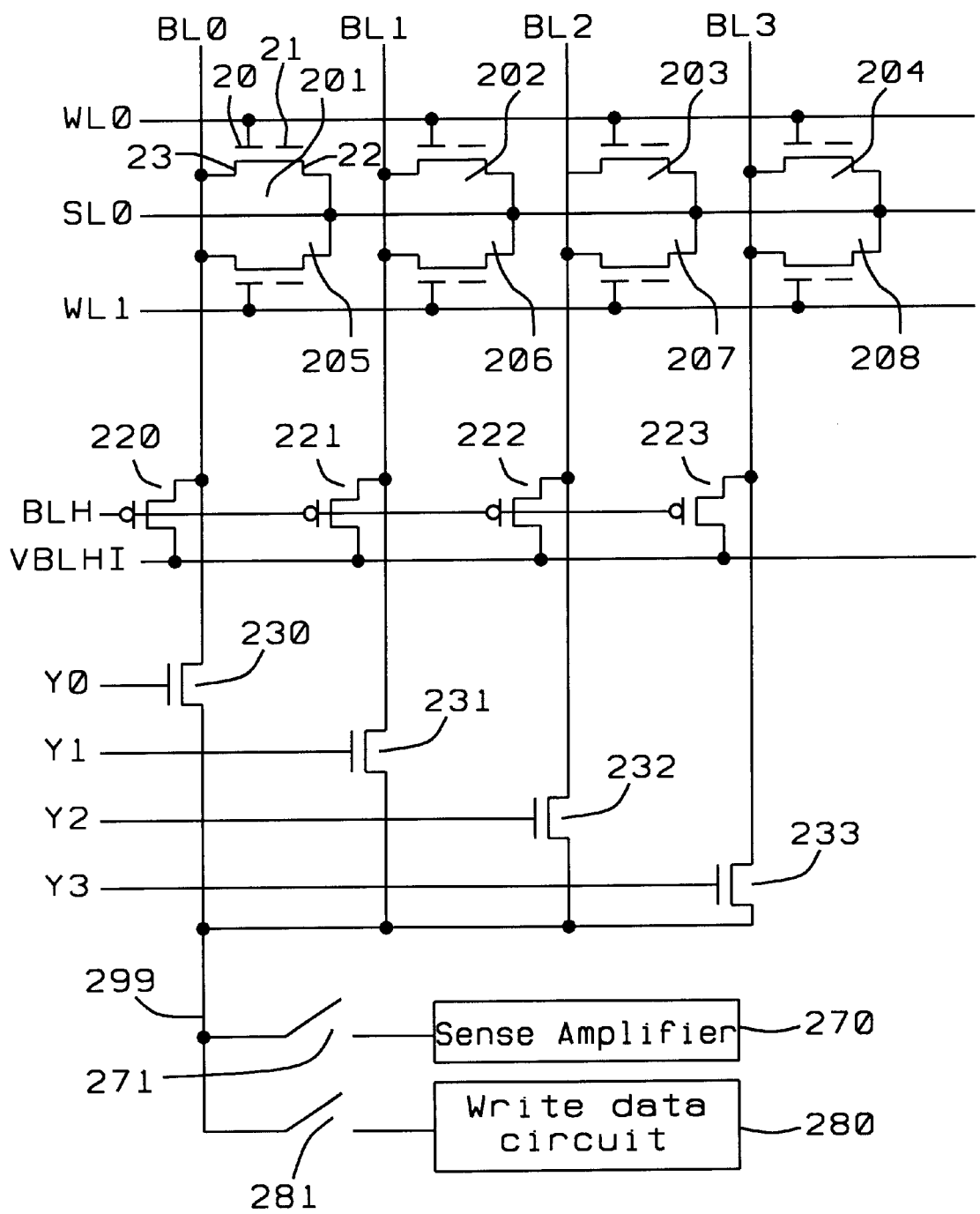
FIG. 3 shows a schematic diagram of a partial memory array of the present invention where precharge circuits for a plurality of bit lines share a same latch in a column decoder.

FIGS. 2A and 2B are shown two types of split gate NOR flash memory cells of the present invention. FIG. 2A shows a split gate, floating gate memory cell that is formed by sidewall spacers so that floating gate 21 is in series with word gate 20. Electrons are stored in floating gate 21. FIG. 2B shows a split gate MONOS memory cell that is formed by sidewall spacers and oxide-nitride-oxide (ONO) film. Electrons that control the data state of the memory cell are stored in the ONO film 27, which lies under the sidewall control gate 28, which is next to word gate 20. For the purpose of description for FIGS. 3 and 4, the memory storage region 21 (27 for a MONOS cell) and word gate 20 are shown in series, the program diffusion 22 is defined as the diffusion on the same side as the memory storage region (either floating gate or ONO film), and the bit diffusion 23 is on the opposite side.

In FIG. 3 is shown the first embodiment of the present invention where a partial array of split-gate NOR flash memory cells is implemented. The program diffusions 22 of all of the memory cell transistors 201, 202, 203, 204, 205, 206, 207, 208 share a common source line SL0. The top row memory cells 201, 202, 203, 204 share a common word line WL0. The bottom row memory transistors 205, 206, 207 208 share word line WL1. The bit diffusions 23 are connected in common columns where memory cells in the same column share bit lines. Memory cells 201 and 205 share bit line BL0, memory cells 202 and 206 share bit line BL1, memory cells 203 and 207 share BL2, and memory cells 204 and 208 share BL3. Precharge transistors 220, 221, 222, 223 are each associated with a bit line. The precharge voltage is VBLHI. The gates of the precharge transistors 220, 221. 222, 223 are connected by a single control signal BLH. One data line 299 is shared by a plurality of bit lines BL0–BL3 through n-channel select transistors 230, 231, 232, 233. The gates of the n-channel select transistors 230, 231, 232, 233 are controlled by y-decode signals Y0, Y1, Y2, Y3, respectively. The sense amplifier 270 and write data circuit 280 can be individually connected to the data line 299 line by switches 271 and 281, respectively.

In the schematic diagram of FIG. 3, one sense amplifier 270 and one write data circuit 280 is shared between 4 bit lines. A decode of 4 bit lines was chosen to simplify explanation, and should not be considered as a limitation. The number of bit lines per sense amplifier and write data circuit can be any desired number. The source line SL0 is connected to only 2 rows of memory cells. A single source line may be connected between as few as 1 row of memory cells to as many as 512 memory cell rows, or more.

Continuing to refer to FIG. 3, for ease of explanation, the voltages for a program operation on memory cell 201, which is a floating gate split gate device, are assumed to be: program diffusion 22 biased to 5V, word gate 20 biased to 5V, and bit diffusion 23 biased to either 0V, or for program inhibit 5V. The bit line program inhibit voltage is chosen to be greater than the word gate voltage minus the word gate threshold voltage. It should be noted that for a split gate MONOS device, the word gate voltage can be as low as, or lower than, the logic power supply. Then the program inhibit voltage is not required to be a high voltage. As shown in FIG .3, several data bit lines share a single data latch by means of select transistors 230, 231, 232, 233. Memory cell 203 is used as the target selected memory cell for explanation of FIGS. 3 and 4. Program data is latched into the write data circuit 280. If the program data is a logical "0", then the memory cell is to be written. If the program data is a logical "1", then the memory cell is not to be written. Before the program sequence begins, assume that the bit lines BL0, BL1, BL2, BL3 are at 0V, or floating around 0V. All of the word lines are unselected at 0V, and the source line SL0 is 0V. Switches 271 and 281 are both open. The voltage of BLH is off, so precharge transistors 220, 221, 222, 223 are non-conducting. The voltage to the gate signals Y0, Y1, Y2, Y3 of the select transistors 230, 231, 232, 233, is 0V. The data line 299 is precharged to the power supply voltage (VDD) by an additional precharge transistor not shown. VBLHI is set to the program inhibit voltage of 5V. In the first step of the program sequence, a 5V bias is applied to SL0, which is connected to the program diffusions of all of the memory cells 201–208. Next, all bit lines BL0–BL3 are precharged to the 5V program inhibit voltage, by means of precharge transistors 220, 221, 222, 223.

Continuing to refer to FIG. 3, after all of the bit lines have been charged to the program inhibit voltage of 5V, BLH is turned off and the bit lines float at 5V. Switch 281 is then closed, connecting the write data circuit to the data line 299. The write data circuit 280 contains a pull-down transistor to ground which conducts or does not conduct, depending upon whether the program data value is a "0" or "1". If the data is a "0", then data line 299 will fall to 0V, otherwise, the data line 299 will be remain precharged near VDD. Next, the bit line BL(2) associated with the target memory cell 203 is selected, by biasing the decode signal Y(2) to VDD. It should be noted that if data line 299 is 0V, the pull-down transistor in the write data circuit will force the bit line BL2 to 0V. If the data line 299 is VDD and the decode signal Y2 is also VDD, then the gate to source voltage of transistor 232 is 0V, and transistor 232 will not conduct. The precharged program inhibit value of 5V will remain on bit line BL2 if the program data is "1", and the memory cell 203 will not be programmed. After the program diffusion and bit diffusion voltages have been setup, the word line WL0 is activated and CHE program injection will begin for the cell 203, if the program data is "0".

The advantages of first embodiment are: 1) The number of sense amplifiers and write data circuits is equal to the program bandwidth, not the number of bit lines. 2) The write data circuit can be simply constructed with logic transistors. No high voltage transistors or level shifters are necessary due of a unique sequence of data line precharge and selective discharge. 3) The decode signals Y0, Y1, Y2, and Y3 can be logic levels. In the conventional method, they would have to be boosted high in order to pass 5V to the bit line for program inhibit. Thus, the oxide thickness of the decode transistors can be reduced and high voltage transistors can be reduced.

In the second embodiment of this invention, the voltage setup sequence differs from the first embodiment in that, during bit line precharge through the precharge transistors 220, 221, 222, 223, the decode transistor 232 is also selected. Thus, data line 299 is precharged high via the n-channel decode device 232, to the voltage of Y2 (VDD) minus the threshold of the n-channel decode device 232. This data line 299 precharge occurs at the same time as the bit line precharge and no extra precharge device is required to specifically recharge data line 299. In a third embodiment of this invention, the p-channel precharge transistors 220, 221, 222, 223 are replaced with n-channel devices, if the desired program inhibit voltage is less than the n-channel gate voltage minus the n-channel threshold.

Figure 4:
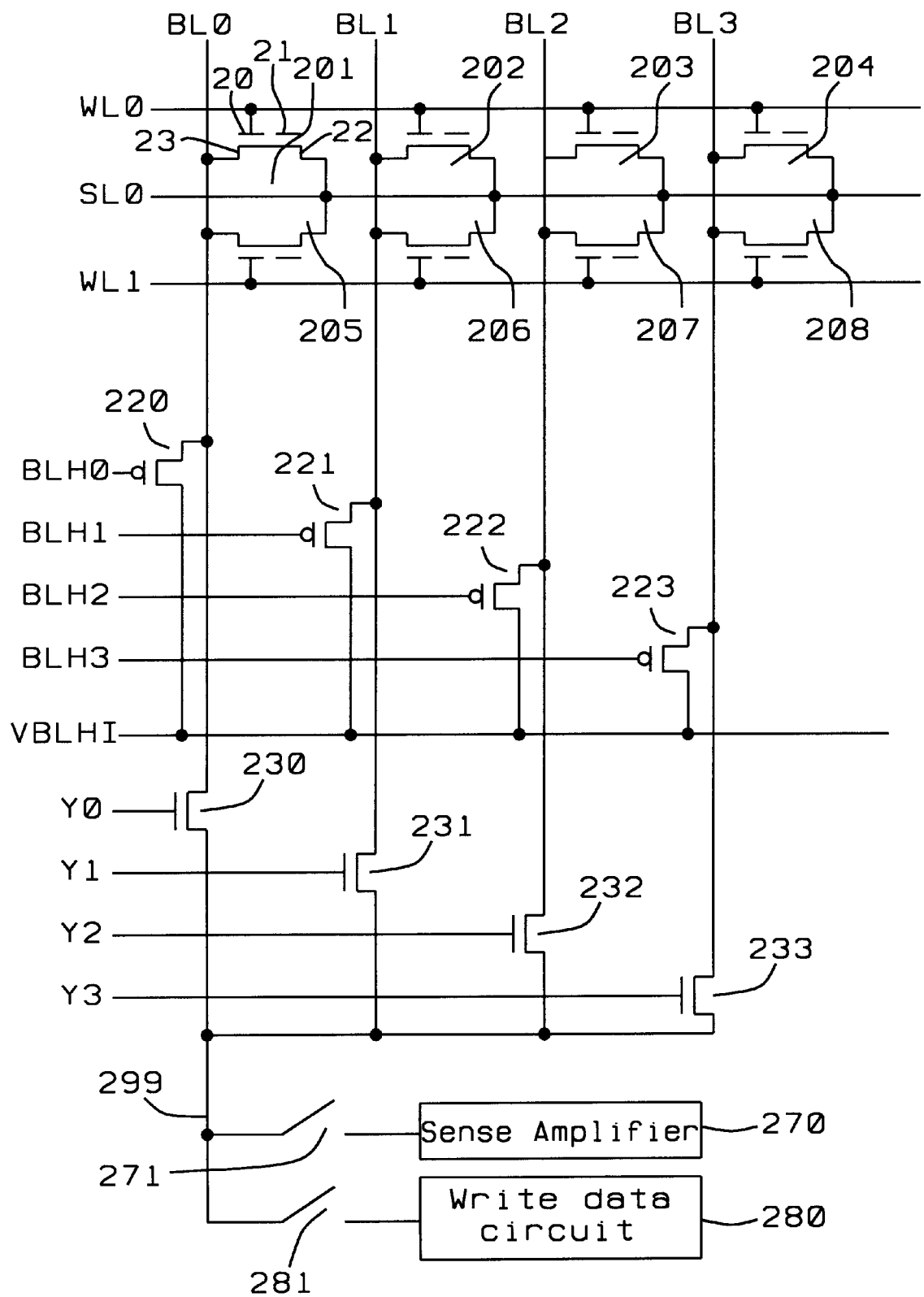
FIG. 4 shows a schematic diagram of a partial memory array of the present invention where precharge circuits connected to bit lines are individually controlled.

FIG. 4 shows a fourth embodiment of this invention in which the signals to the gates of the precharge transistors are separated, for individual transistor control. The control line BLH shown in FIG. 3 becomes BLH0 to BLH3 in FIG. 4. This capability to selectively precharge bit lines is useful during the read operation, for low power, low current applications. During program and considering the same power and current constraints as well as the program inhibit voltage charge pump limitations, it may be impractical to precharge all bit lines to 5V at once. Instead, the bit lines may be precharged singularly, or grouped, in any sequence, as long as all of the bit lines that are associated with the memory cells on a given word line are precharged to the program inhibit voltage, prior to accessing the memory cell.

Figure 5:
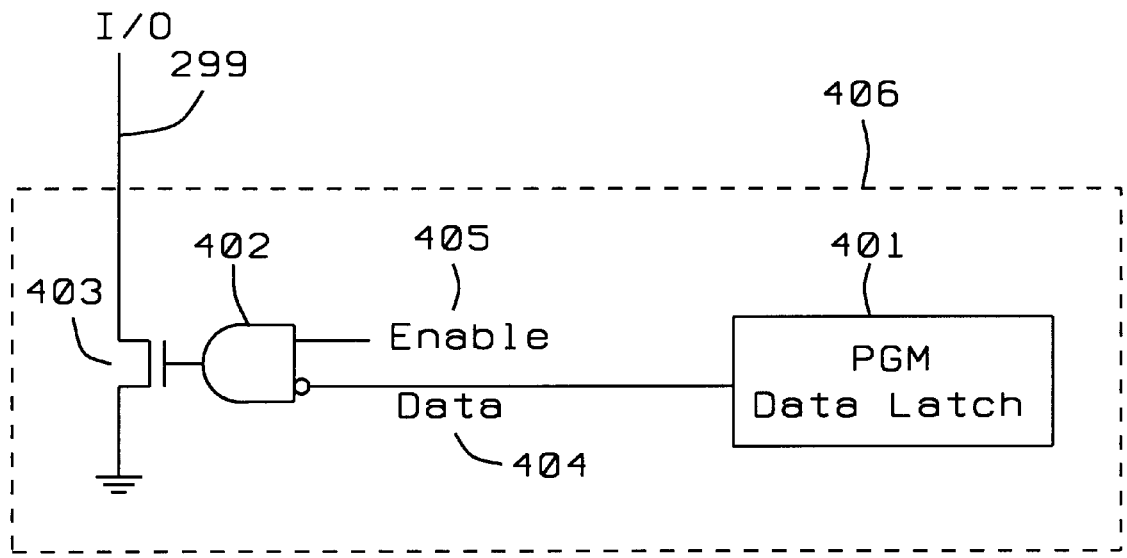
FIG. 5 shows a circuit diagram of a write data latch of the present invention.
Figure 6:
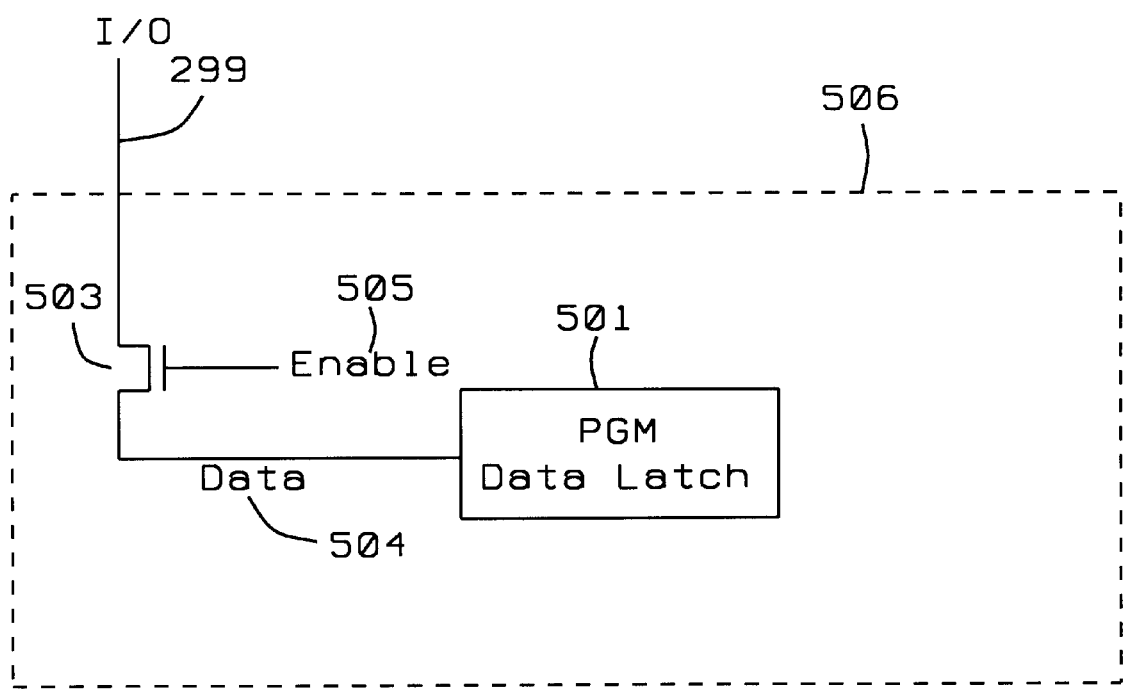
FIG. 6 shows a circuit diagram of a write data latch of the present invention having an optimized number of transistors.

Two variations of circuit implementation for the write data latch 280 in FIG. 3 are given in FIG. 5 and FIG. 6. In FIG. 5, the data line 299 is connected to the drain of pull down transistor 403, the source of transistor 403 is grounded. The gate of the pull down transistor 403 is controlled by a logical AND of DATA_ENABLE 405 and NOT PGM_DATA 404. The signal PGM_DATA is the program data from the PGM data latch 401. DATA_ENABLE is a control logic signal which has the functional equivalent of the switch 281 in FIG. 3. When DATA_ENABLE and NOT PGM_DATA are high, then the pull-down transistor 403 is activated and the data line 299 is pulled down to ground.

The circuit of FIG. 6 has the same equivalent function as the write data circuit 280 in FIG. 4. However, the number of transistors has been optimized. The drain of pull-down transistor 504 is also data line 299. But instead of placing an AND circuit at the gate of the pull-down transistor 503, the PGM_DATA" 504 is connected to the source of transistor 503. The gate of the pull-down transistor 503 is simply DATA_ENABLE. When PGM_DATA=0 and the DATA_ENABLE is high, then the pull-down transistor 503 is activated and data line 299 is connected to ground.

While the invention has been particularly shown and described with reference to preferred embodiments thereof, it will be understood by those skilled in the art that various changes in form and details may be made without departing from the spirit and scope of the invention.

What is claimed is:

1. A method of programming a nonvolatile memory, comprising:
    a) latching program data into a write circuit and precharging a data line with said program data,
    b) applying a high voltage to a source line coupled to a plurality of memory cells,
    c) precharging a bit line to a program inhibit voltage,
    d) floating said bit line after said bit line has been precharged,
    e) selecting said bit line to couple said program data to a selected memory cell to be programmed,
    f) selecting a word line connected to a word gate of said selected memory cell,
    g) programming said selected memory cell when said program data is a low voltage.
2. The method of claim 1, wherein selecting said bit line couples said program data from said data line onto said bit line.
3. The method of claim 1, wherein precharging said bit line is done with a plurality of bit lines simultaneously.
4. The method of claim 1, wherein floating said bit line after said bit line precharge maintains precharge voltage on said bit line.
5. The method of claim 1, wherein selecting said bit line that couples program data to said bit line is done simultaneous with precharging said bit line such that said bit line is precharged to the voltage of said program data.
6. The method of claim 1, wherein precharging said bit line is done by means of a P-channel transistor coupled to said bit line.
7. The method of claim 1, wherein precharging said bit line is done by means of an N-channel transistor coupled to said bit line.
8. The method of claim 1, wherein said memory cells are nonvolatile floating gate memory cells.
9. The method of claim 1, wherein said memory cells are MONOS memory cells.
10. The method of claim 1, wherein programming of said cell is accomplished by means of CHE (channel hot electron) programming.
11. A nonvolatile memory, comprising:
    a) memory cells organized in rows and columns,
    b) a bit line coupled to bit diffusions of said memory cells in said columns,
    c) a word line coupled to word gates of said memory cells in said rows,
    d) a source line coupled to program diffusions of said memory cells,
    e) a precharge circuit coupled to said bit line, whereby said precharge circuit charges said bit line to a program inhibit voltage and then uncouples from said bit line leaving the bit line floating at said program inhibit voltage,
    f) a write data circuit containing program data,
    g) a select circuit controlled by a Y-decoder select signal couples program data to said bit line, whereby a selected cell is programmed by said program data when said program data is a low voltage.
12. The memory of claim 11, wherein said source line is coupled to a single row of said memory cells.
13. The memory of claim 11, wherein said source line is coupled to a plurality of rows of said memory cells.
14. The memory of claim 11, wherein said precharge circuit establishes a floating program inhibit voltage on said bit lines prior to programming said cells.
15. The memory of claim 14 wherein said program inhibit voltage is greater than a voltage on said word line minus a threshold voltage of said word gate.
16. The memory of claim 14, wherein said program data is coupled to said bit line selected to be programmed after said floating program inhibit voltage is established by said precharge circuit.
17. The memory of claim 14, wherein said program data is coupled to said bit line selected to be programmed simultaneous to said precharge circuit establishing a floating program voltage to eliminate a charging cycle of said bit line to be programmed.
18. The memory of claim 11, wherein a plurality of said precharge circuits are coupled simultaneously to a plurality of said bit lines to program inhibit said memory cells coupled to said plurality of bit lines.
19. The memory of claim 11, wherein said memory cells are nonvolatile floating gate devices.
20. The memory of claim 11, wherein said memory cells are MONOS type devices.
21. The memory of claim 11, wherein said precharge circuit is comprised of a P-channel transistor.
22. The memory of claim 11, wherein said precharge cicuit is comprised of an N-channel transistor.
23. A circuit and programming means to reduce a number of sense amplifiers and write data circuits, comprising:

a) a means to couple bit lines to bit diffusions of memory cells in a column of a nonvolatile memory,
b) a means to couple word lines to control gates of memory cells in a row of said nonvolatile memory,
c) a means to couple source lines to program diffusions in said row of said nonvolatile memory,
d) a means to precharge bit lines to a precharge voltage and then float said precharge voltage on a plurality of said bit lines to program inhibit said memory cells,
e) a means to couple program data to a selected bit line to replace said precharge voltage and to program a cell selected by said word line means and said bit line means when said program data is a low voltage.

24. The circuit and programming means of claim 23, wherein said means to couple source lines to program diffusions is done for a plurality of said rows using one source line.

25. The circuit and programming means of claim 23, wherein the means to precharge bit lines and then float said precharge voltage is done for a plurality of bit lines.

26. The circuit and programming means of claim 23, wherein the means to precharge bit lines and then float said precharge voltage is done for a single selected bit line to accommodate low power requirements.

27. The circuit and programming means of claim 23, wherein the means to precharge bit lines is done simultaneous with the means to couple program data to an addressed bit line to reduce to one a number of times a bit line is charged during a program operation.

* * * * *